(12) United States Patent
Augustin

(10) Patent No.: US 12,105,546 B2
(45) Date of Patent: Oct. 1, 2024

(54) CONTROL CIRCUIT AND CONTROL UNIT FOR A VEHICLE

(71) Applicant: Schaeffler Technologies AG & Co. KG, Herzogenaurach (DE)

(72) Inventor: Patrick Augustin, Bühl (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 0 days.

(21) Appl. No.: 17/914,401

(22) PCT Filed: Mar. 8, 2021

(86) PCT No.: PCT/DE2021/100231
§ 371 (c)(1),
(2) Date: Sep. 26, 2022

(87) PCT Pub. No.: WO2021/204320
PCT Pub. Date: Oct. 14, 2021

(65) Prior Publication Data
US 2023/0350444 A1    Nov. 2, 2023

(30) Foreign Application Priority Data

Apr. 8, 2020 (DE) ...................... 10 2020 109 758.1

(51) Int. Cl.
*G05F 1/56* (2006.01)
*B60R 16/033* (2006.01)

(52) U.S. Cl.
CPC .............. *G05F 1/56* (2013.01); *B60R 16/033* (2013.01)

(58) Field of Classification Search
None
See application file for complete search history.

(56) References Cited

U.S. PATENT DOCUMENTS

| 5,587,895 | A | * | 12/1996 | Harkins | ............. | H02M 7/2176 |
| | | | | | | 363/127 |
| 5,652,825 | A | * | 7/1997 | Schmider | ................. | H02P 4/00 |
| | | | | | | 388/822 |
| 5,790,060 | A | * | 8/1998 | Tesch | .................... | H03M 1/089 |
| | | | | | | 341/145 |
| 5,801,933 | A | * | 9/1998 | Ravid | ................ | H02M 7/2176 |
| | | | | | | 363/126 |

(Continued)

FOREIGN PATENT DOCUMENTS

| DE | 102010033836 A1 | 3/2011 |
| DE | 102012107028 B3 | 11/2013 |

(Continued)

*Primary Examiner* — Thomas J. Hiltunen

(57) ABSTRACT

A control circuit for a control unit, which is located in a vehicle and is configured to be switched between an energy-saving state that has a limited range of functions and a normal operational state depending on an output voltage received from the control circuit (10), includes a field-effector transistor. The field-effect transistor is configured to receive a supply voltage. The field-effect transistor is further configured to switch between control states based on a control voltage applied at a gate terminal. The control states are an on-state and an off-state. The field-effect transistor is further configured to provide the output voltage based on the control state of the field-effect transistor.

20 Claims, 2 Drawing Sheets

(56) References Cited

U.S. PATENT DOCUMENTS

| | | | | |
|---|---|---|---|---|
| 6,094,040 | A * | 7/2000 | Meier | G05F 1/575 323/284 |
| 6,300,748 | B1 * | 10/2001 | Miller | G05F 1/565 363/126 |
| 7,139,157 | B2 * | 11/2006 | Taylor | H02H 3/202 361/84 |
| 7,362,157 | B2 * | 4/2008 | Logiudice | G05F 1/575 327/318 |
| 7,889,526 | B2 * | 2/2011 | Baby | H02M 7/2176 323/299 |
| 8,193,775 | B2 * | 6/2012 | Park | H03K 17/14 320/134 |
| 9,000,825 | B2 * | 4/2015 | van Liempd | H03K 3/012 327/104 |
| 9,077,256 | B2 * | 7/2015 | Basso | H05K 13/00 |
| 10,778,019 | B2 * | 9/2020 | Gagnon | H02H 3/18 |
| 11,728,643 | B2 * | 8/2023 | Damodaran Prabha | H01L 29/866 361/56 |
| 2023/0067227 | A1 * | 3/2023 | Telefus | H02M 7/2176 |

FOREIGN PATENT DOCUMENTS

| | | |
|---|---|---|
| DE | 102011014512 B4 | 3/2014 |
| DE | 102016100224 B3 | 5/2017 |
| DE | 102017109684 A1 | 11/2018 |
| DE | 112016007452 T5 | 8/2019 |
| DE | 102018130764 A1 | 6/2020 |

* cited by examiner

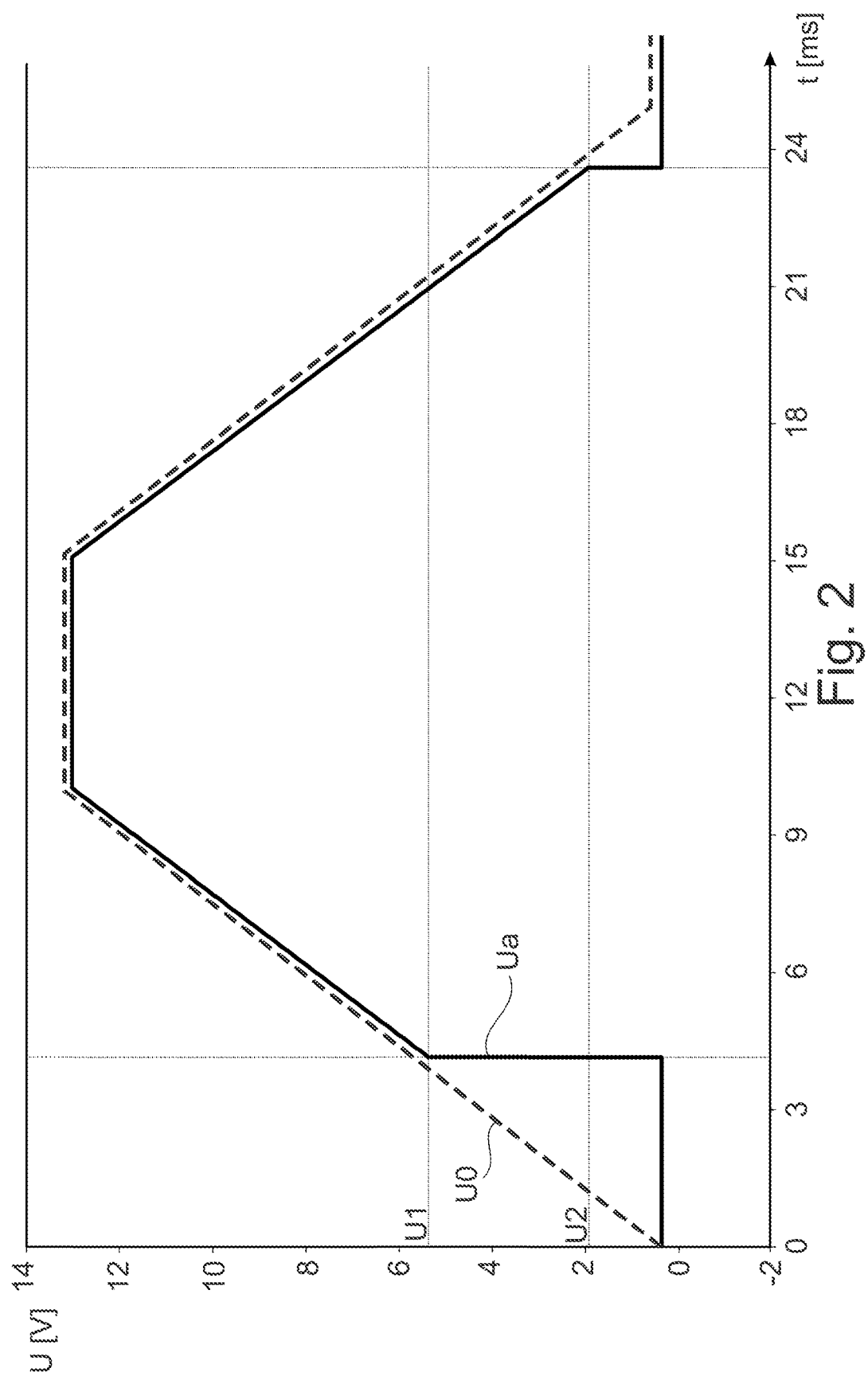

CONTROL CIRCUIT AND CONTROL UNIT FOR A VEHICLE

CROSS-REFERENCE TO RELATED APPLICATIONS

This application is the U.S. National Phase of PCT Appln. No. PCT/DE2021/100231 filed Mar. 8, 2021, which claims priority to DE 102020109758.1 filed Apr. 8, 2020, the entire disclosures of which are incorporated by reference herein.

TECHNICAL FIELD

The disclosure relates generally to a control circuit, and more specifically, to a control unit having such a control circuit.

BACKGROUND

A control circuit for a control unit in a motor vehicle can bring about an energy-saving state or a normal operating state of the control unit, depending on an output voltage provided on an output side of the control circuit. In the energy-saving state, the electrical energy consumption of the control unit is greatly reduced and, as a result, takes up little battery capacity of the vehicle. Triggered by a wake-up event, the control unit can be switched over to the normal operating state by the control circuit via the output voltage and can carry out the functions assigned thereto.

SUMMARY

The disclosure, according to an exemplary embodiment, provides a more energy-saving control circuit. As a result, the control circuit can be operated more reliably. The electric power consumption, e.g., the quiescent current, of the control circuit in the energy-saving state is to be further reduced. In particular, the energy consumption, e.g., the quiescent current, in the energy-saving state should be less than or equal to 100 µA.

An output voltage can be a drain-source voltage of a field-effect transistor. The output voltage can depend directly on a supply voltage. The supply voltage can be dependent on a switch-on position of a switch-on element of a vehicle. The switch-on element can be a switch-on button of the vehicle. The supply voltage can be applied to a KL 15 connection on the vehicle.

The field-effect transistor can be a p-channel or n-channel MOSFET.

When the field-effect transistor is switched on, the output voltage can be equal to the supply voltage. The supply voltage can depend on a battery supply voltage. The battery supply voltage can be provided by a vehicle battery, in particular a 12V, 24V or 48V battery.

In embodiments, the control circuit has a first switching element, which switches on a control voltage as a function of a ratio between the supply voltage and a first voltage value. The first voltage value can be between 20% and 80% of the supply voltage. The first voltage value can correspond to a switch-on voltage of the field-effect transistor.

In embodiments, a gate connection of the first switching element is connected to the field-effect transistor on an input side. As a result, the first switching element can be switched over via the supply voltage.

In embodiments, the first voltage value can be set via a voltage divider assigned to the gate connection of the first switching element. As a result, the first voltage value can be set easily and inexpensively.

In embodiments, the control circuit has a second switching element, which switches on the control voltage as a function of a ratio between the output voltage and a second voltage value. As a result, the control voltage of the switched-through field-effect transistor can be controlled independently of the switching state of the first switching element.

The second voltage value can be between 20% and 80% of the output voltage and/or supply voltage. The second voltage value can correspond to a switch-off voltage of the field-effect transistor.

In embodiments, a gate connection of the second switching element is connected on an output side of the field-effect transistor. As a result, the second switching element can be switched depending on the output voltage.

In embodiments, the first voltage value is greater than the second voltage value. The first voltage value can be 10% to 50% higher than the second voltage value.

In embodiments, the first and second switching elements are connected in parallel between the gate connection of the field-effect transistor and ground. As a result, the control voltage of the field-effect transistor can be controlled by the first and second switching elements.

In embodiments, the first and second switching elements are of identical construction. As a result, the control circuit can be implemented inexpensively.

To solve at least one of the above-mentioned tasks, a control unit for the vehicle for controlling at least one vehicle component is also proposed, having a control circuit with at least one of the above features for switching between an energy-saving state and a normal operating state.

The control unit can be a vehicle control unit. The control unit can control at least one vehicle component of the vehicle, for example a drive element and/or a clutch. The control unit can be supplied with a battery supply voltage. The battery supply voltage can also be present at the control unit when the vehicle is switched off. The battery supply voltage can be 12 V, 24 V or 48 V.

BRIEF DESCRIPTION OF THE DRAWINGS

Further advantages and advantageous embodiments of the disclosure result from the description of the drawings and the drawings. The disclosure is described in detail below with reference to the drawings. Specifically:

FIG. 2: shows a voltage diagram of a control circuit in the exemplary embodiment of the disclosure.

DETAILED DESCRIPTION

Figure 1:
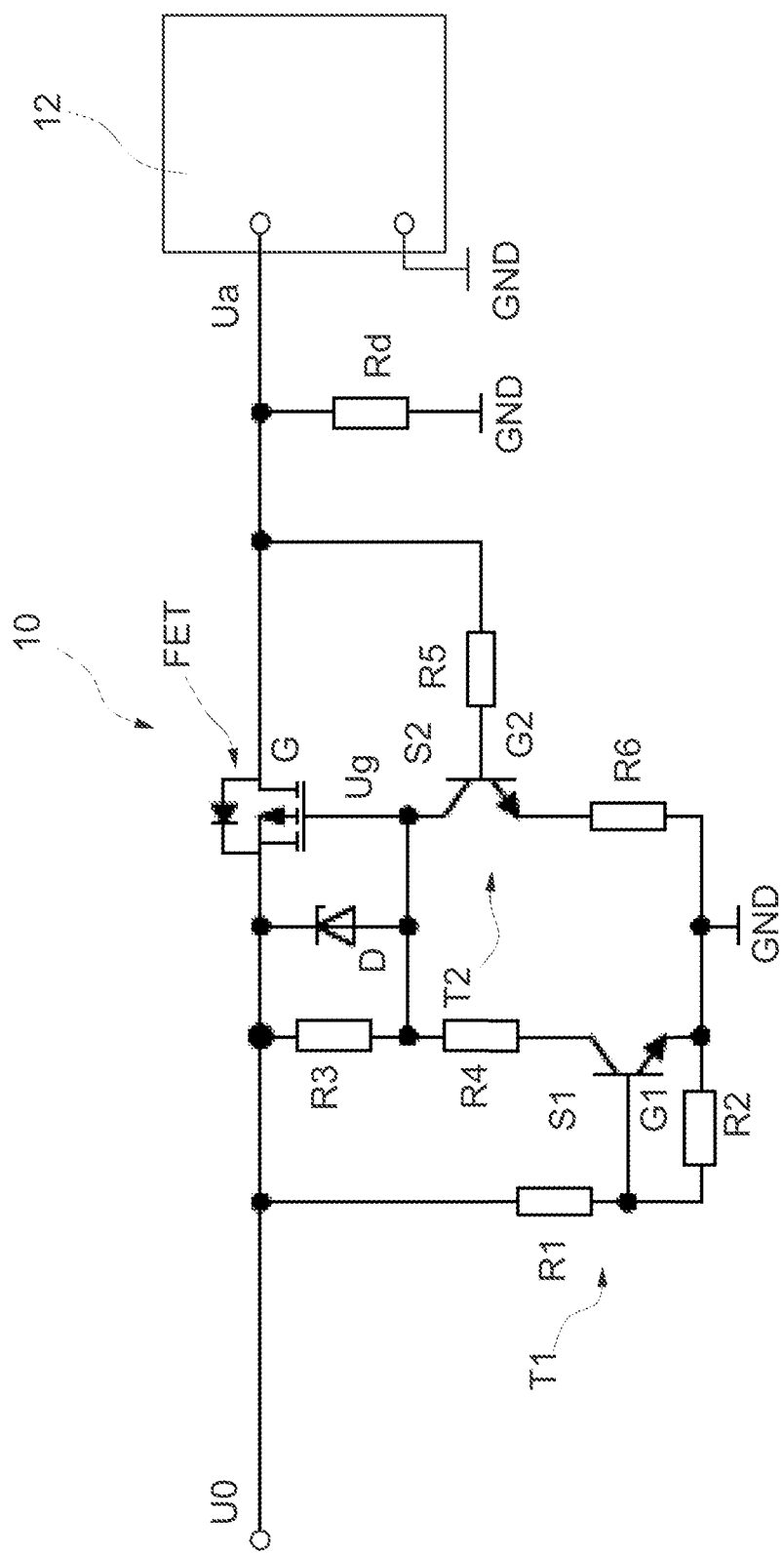
FIG. 1: shows a control circuit and a control unit in an exemplary embodiment of the disclosure.

FIG. 1 shows a control circuit 10 and a control unit 12 in an exemplary embodiment of the disclosure. The control unit 12 can be arranged in a vehicle to control at least one vehicle component and assume an energy-saving state in which the power consumption of the control unit 12 is reduced. As a result, electrical energy for supplying the control unit 12 can be saved if the functions of the control unit 12 are not required or are only partially required. For example, the energy-saving state can be entered when the vehicle is not being operated.

The vehicle can have a switch-on element, for example a start button, with which the vehicle can be switched on and switched off depending on a switch-on position of the switch-on element. The vehicle provides power to various components as well as the control unit 12 from a vehicle battery, which outputs a battery supply voltage and has a limited capacity. A supply voltage U0 is present depending on the switch-on position. If the switch-on element is switched on, for example, the supply voltage U0 is equal to the battery supply voltage after a running-in period. If, on the other hand, the switch-on element is switched off, then the supply voltage is zero. The supply voltage U0 can be a terminal voltage at KL 15.

If several components are operated with the battery supply voltage when the vehicle is switched off, the capacity of the vehicle battery can be quickly exhausted. For this reason, it is advantageous to place various components including the control unit 12 in an energy-saving state in which power consumption is reduced, particularly when the vehicle is switched off.

The control unit 12 can be switched over between the energy-saving state and a normal operating state depending on an output voltage Ua of the control circuit 10. For this purpose, the control unit 12 is electrically connected to the control circuit 10. Also, the control circuit 10 can be built into the control unit 12.

The output voltage Ua is applied on an output side of the control circuit 10 and on an input side of the control unit 12. The control circuit 10 has a field-effect transistor FET, which can be controlled by a control voltage Ug at a gate connection G. The output voltage Ua is dependent on a control state of the field-effect transistor FET. Thereby, the power consumption of the control circuit 10 can be reduced even in the energy-saving state. A quiescent current of the control circuit 10 required in the energy-saving state is less than 100 µA and thus meets the strict requirements for the energy consumption of vehicles.

The output voltage Ua and the control voltage Ug depend on a supply voltage U0, in particular on the terminal voltage at KL 15, and are controlled by a first switching element S1 of the control circuit 10. The first switching element S1 may be designed as an NPN transistor and switches the control voltage Ug depending on a ratio between the supply voltage U0 and a first voltage value via a gate connection G1 on the first switching element S1.

The supply voltage U0 can be between 0 V and the battery supply voltage, in particular 12 V. The gate connection G1 is connected to the supply voltage U0 on an input side of the field-effect transistor FET via a first voltage divider T1 formed from a first resistor R1, in particular with a value of 10 kOhm, and a second resistor R2, in particular with a value of 1200 Ohm. The first voltage value can be set via the first voltage divider T1.

As soon as the supply voltage U0 reaches the first voltage value, for example 5.37 V, the first switching element S1 is switched on and provides the control voltage Ug at the gate connection G of the field-effect transistor FET via a third resistor R3, in particular with a value of 10 kOhm. As a result, the field-effect transistor FET is switched on and the output voltage Ua corresponding to the supply voltage U0 is applied on the output side of the field-effect transistor FET. The third resistor R3 is a pull-up resistor across which the control voltage Ug remains absent as long as the first switching element S1 is locked. A fourth resistor R4, in particular with a value of 8200 ohms, is operatively arranged in series between the gate connection G and the first switching element S1 for limiting the current through the first switching element S1.

The field-effect transistor FET may be designed as a MOSFET, in particular as a p-channel MOSFET. A pull-down resistor Rd with a value of 33 kOhm is arranged on an output side of the field-effect transistor FET, which can also be omitted depending on the requirements of the control unit 12. On the input side of the field-effect transistor FET and connected to the gate connection G, a diode D is arranged as overvoltage protection for the field-effect transistor FET.

A second switching element S2, which may be designed to be structurally identical to the first switching element S1, has a gate connection G2, which is connected to the field-effect transistor FET on the output side. The second switching element S2 may be designed as an NPN transistor. The output voltage Ua is applied at the gate connection G2 via a fifth resistor R5, in particular with a value of 1 kOhm.

A sixth resistor R6, in particular with a value of 8200 ohms, limits the current through the second switching element S2. The second switching element S2 enables the control voltage Ug when the field-effect transistor FET is switched on even when the first switching element S1 is locked. As a result, the control voltage Ug can be present at voltages above a second voltage value of the supply voltage U0 or the output voltage Ua via the second voltage divider T2 formed by the third resistor R3 and sixth resistor R6.

The second voltage value is preferably smaller than the first voltage value. As a result, the switch-on voltage of the supply voltage U0 corresponding to the first voltage value is different from the switch-off voltage of the output voltage Ua corresponding to the second voltage value.

FIG. 2 shows a voltage diagram of a control circuit in the exemplary embodiment of the disclosure. If the supply voltage U0 is switched on, it increases over time and as soon as a first voltage value U1 is reached, the field-effect transistor is switched on and the output voltage UA equals the supply voltage U0.

If the supply voltage U0 is switched off, it falls over time and the field-effect transistor remains switched on up to a second voltage value U2, and only when the supply voltage U0 is lower than the second voltage value U2 is the field-effect transistor switched off and is voltage-free on the output side.

LIST OF REFERENCE SYMBOLS

10 Control circuit
12 Control unit
D Diode
G Gate connection
G1 Gate connection
G2 Gate connection
R1-R6 Resistor
S1 First switching element
S2 Second switching element
U0 Supply voltage
U1 First voltage value
U2 Second voltage value
Ua Output voltage
Ug Control voltage

The invention claimed is:

1. A control circuit for a control unit arranged in a vehicle and configured to be switched between an energy-saving state with a limited range of functions and a normal operating state based on an output voltage received from the control circuit, the control circuit comprising:
 a field-effect transistor configured to:
  receive a supply voltage;
  switch between control states based on a control voltage applied at a gate connection, wherein the control states are an on-state and an off-state; and
  provide the output voltage based on the control state; and wherein the control circuit includes a first switching element configured to provide the control voltage when the supply voltage is greater than or equal to a first voltage value; and when the supply voltage decreases after the vehicle has been switched off, the field-effect transistor remains switched on until the supply voltage decreases to a value less than a second voltage value at which time the field-effect transistor is switched off via a second switching element of the control circuit, the second voltage value:

less than the first voltage value; and set via a base connection of the second switching element.

2. The control circuit according to claim 1, wherein a base connection of the first switching element is connected on an input side of the field-effect transistor.

3. The control circuit according to claim 2, wherein the first voltage value can be set via a voltage divider assigned to the base connection of the first switching element.

4. The control circuit according to claim 1, wherein the base connection of the second switching element is connected to an output side of the field-effect transistor.

5. The control circuit according to claim 1, wherein the first voltage value is greater than the second voltage value.

6. The control circuit according to claim 1, wherein the first and second switching elements are connected in parallel between the gate connection of the field-effect transistor and ground.

7. The control circuit according to claim 1, wherein the first switching element is configured to stop providing the control voltage based on the supply voltage being less than the first voltage value.

8. The control circuit according to claim 1, wherein the output voltage equals the supply voltage when the field-effect transistor is in the on-state, and the output voltage equals zero when the field-effect transistor is in the off-state.

9. The control circuit according to claim 1, wherein the field-effect transistor is configured to be in the on-state when receiving the control voltage via the gate connection and to be in the off-state when not receiving the control voltage via the gate connection.

10. The control circuit according to claim 1, wherein the second switching element is configured to stop providing the control voltage based on the output voltage being less than or equal to the second voltage value.

11. The control unit according to claim 1, wherein when the supply voltage is equal to the first voltage value, the output voltage equals the supply voltage.

12. The control unit according to claim 1, wherein the second voltage value is greater than zero.

13. The control unit according to claim 1, wherein the first voltage value and the second voltage value are between 20 to 80 percent of the output voltage.

14. The control unit according to claim 13, wherein the first voltage value is 10 to 50 percent higher than the second voltage value.

15. A control unit for a vehicle for controlling at least one vehicle component, comprising:

a control circuit configured to switch the control unit between an energy-saving mode and a normal operating mode based on an output voltage, the control circuit including a field-effect transistor configured to:

receive a supply voltage;

switch between control states of the field-effect transistor based on a control voltage applied at a gate connection, wherein the control states are an on-state and an off-state; and provide the output voltage to the control unit based on the control state;

wherein the control circuit includes a first switching element configured to provide the control voltage when the supply voltage is greater than or equal to a first voltage value; and when the supply voltage decreases after the vehicle has been switched off, the field-effect transistor remains switched on until the supply voltage decreases to a value less than a second voltage value at which time the field-effect transistor is switched off via a second switching element of the control circuit, the second voltage value:

less than the first voltage value; and the second voltage value is set via a base connection of the second switching element.

16. The control unit according to claim 15, wherein the output voltage equals the supply voltage when the field-effect transistor is in the on-state, and the output voltage equals zero when the field-effect transistor is in the off-state.

17. The control unit according to claim 15, wherein the first voltage value is greater than the second voltage value.

18. The control unit according to claim 15, wherein the first switching element is configured to stop providing the control voltage based on the supply voltage being less than the first voltage value.

19. The control unit according to claim 15, wherein the second switching element is configured to stop providing the control voltage based on the output voltage being less than or equal to the second voltage value.

20. The control unit according to claim 15, wherein the field-effect transistor is configured to be in the on-state when receiving the control voltage via the gate connection and to be in the off-state when not receiving the control voltage via the gate connection.

* * * * *